(12) United States Patent
Cheng (10) Patent No.: US 12,408,402 B2
(45) Date of Patent: Sep. 2, 2025

(54) GaN-BASED SEMICONDUCTOR STRUCTURES

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 639 days.

(21) Appl. No.: 17/840,995

(22) Filed: Jun. 15, 2022

(65) Prior Publication Data

US 2023/0077826 A1    Mar. 16, 2023

(30) Foreign Application Priority Data

Sep. 15, 2021   (CN) .......................... 202122239416.7

(51) Int. Cl.
| | |
|---|---|
| *H10D 62/85* | (2025.01) |
| *H01L 21/02* | (2006.01) |
| *H10D 30/01* | (2025.01) |
| *H10D 62/824* | (2025.01) |

(52) U.S. Cl.
CPC ..... *H10D 62/8503* (2025.01); *H01L 21/0254* (2013.01); *H10D 30/015* (2025.01); *H10D 62/824* (2025.01)

(58) Field of Classification Search
CPC . H10D 62/8503; H10D 30/015; H10D 62/824
See application file for complete search history.

(56) References Cited

U.S. PATENT DOCUMENTS

2020/0388701 A1* 12/2020 Hickman ............. H10D 64/411

* cited by examiner

*Primary Examiner* — Trang Q Tran
(74) *Attorney, Agent, or Firm* — The Small Patent Law Group LLC; Christopher R. Carroll (57) ABSTRACT

The present disclosure provides a GaN-based semiconductor structure, including: a substrate; a channel layer; a barrier layer, where the channel layer and the barrier layer each include a gate region, a source region and a drain region; a source region N-type ion heavily-doped layer located in the source region; a drain region N-type ion heavily-doped layer located in the drain region; a gate electrode located in the gate region; a source electrode located on the source region N-type ion heavily-doped layer; and a drain electrode located on the drain region N-type ion heavily-doped layer.

17 Claims, 9 Drawing Sheets

GaN-BASED SEMICONDUCTOR STRUCTURES

CROSS-REFERENCE TO RELATED APPLICATIONS

This application claims priority to Chinese Patent Application No. 202122239416.7, filed on Sep. 15, 2021, the entire content of which is incorporated herein by reference.

TECHNICAL FIELD

The present disclosure relates to the field of semiconductor technologies, and in particular, to GaN-based semiconductor structures.

BACKGROUND

Wide band-gap semiconductor materials such as GaN-based materials, as a typical representative of a third generation of semiconductor materials, have excellent characteristics of large band gap, high pressure resistance, high temperature resistance, high electron saturation and drift velocity, and easy formation of high-quality heterostructures, and are very suitable for manufacturing high-temperature, high-frequency, high-power electronic devices. In recent years, research on GaN-based HEMT (High Electron Mobility Transistor) microelectronic devices has achieved remarkable results and rapid development.

However, on-resistance of the GaN-based HEMT microelectronic devices is relatively large.

SUMMARY

The present disclosure provides a GaN-based semiconductor structure, including: a substrate; a channel layer and a barrier layer sequentially stacked on the substrate from bottom to up, where the channel layer and the barrier layer each include a gate region, a source region and a drain region located on both sides of the gate region; a source region N-type ion heavily-doped layer located in the source region; a drain region N-type ion heavily-doped layer located in the drain region, where a part of at least one of the source region N-type ion heavily-doped layer or the drain region N-type ion heavily-doped layer extends into the barrier layer and a part of the channel layer in the thickness direction; a gate electrode located in the gate region; a source electrode located on the source region N-type ion heavily-doped layer; and a drain electrode located on the drain region N-type ion heavily-doped layer.

DETAILED DESCRIPTION OF THE EMBODIMENTS

In order to make the objects, features, and advantages of the present disclosure more obvious and understandable, specific embodiments of the present disclosure will be described in detail below with reference to the accompanying drawings.

In processes for manufacturing GaN-based HEMT devices, a source-drain ohmic contact process is one of key technologies, which directly affects frequency and power performance of the devices. Secondary epitaxial growth of N-type ion heavily-doped GaN layers in ohmic contact regions to reduce ohmic contact resistivity and improve surface morphology has become a new international process in recent years. Ohmic contact resistance achieved by this process mainly includes contact resistance between metals and N-type ion heavily-doped layers, body resistance of the N-type ion heavily-doped layers, and contact resistance between the N-type ion heavily-doped layers and side walls of heterojunction.

Inventors found that: 1) a magnitude order of resistance between a source electrode and a source region N-type ion heavily-doped layer is about two decimal places; 2) a magnitude order of self-resistance of the source region N-type ion heavily-doped layer is about four decimal places; 3) a magnitude order of resistance between the source region N-type ion heavily-doped layer and a heterojunction interface is about one decimal place; 4) a magnitude order of flowing resistance of a two-dimensional electron gas (2DEG) at the heterojunction interface is about two decimal places; 5) a magnitude order of resistance between a drain region N-type ion heavily-doped layer and the heterojunction interface is about one decimal place; 6) a magnitude order of self-resistance of the drain region N-type ion heavily-doped layer is about four decimal places; 7) a magnitude order of resistance between a drain electrode and the drain region N-type ion heavily-doped layer is about two decimal places. It can be seen that 3) the resistance between the source region N-type ion heavily-doped layer and the heterojunction interface and 5) the resistance between the drain region N-type ion heavily-doped layer and the heterojunction interface are much larger than resistance of other factors. Contact between N-type ion heavily-doped layers and side walls of heterojunction directly affects contact resistance between the N-type ion heavily-doped layers and the side walls of heterojunction. This contact resistance has greatest impacts on overall ohmic contact, so that effectively reducing the contact resistance between the N-type ion heavily-doped layer and the side walls of heterojunction can significantly reduce overall on-resistance of the GaN-based HEMT devices.

Based on the above analysis, in the embodiments of the present disclosure, a part of at least one of a source region N-type ion heavily-doped layer or a drain region N-type ion heavily-doped layer is embedded into a barrier layer and a part of a channel layer in the thickness direction, i.e., extends below a heterojunction interface between the barrier layer and the channel layer. In this way, a collection area of a two-dimensional electron gas in a path from a source electrode to a channel and/or from the channel to a drain electrode can be increased, thereby reducing the on-resistance.

Figure 1:
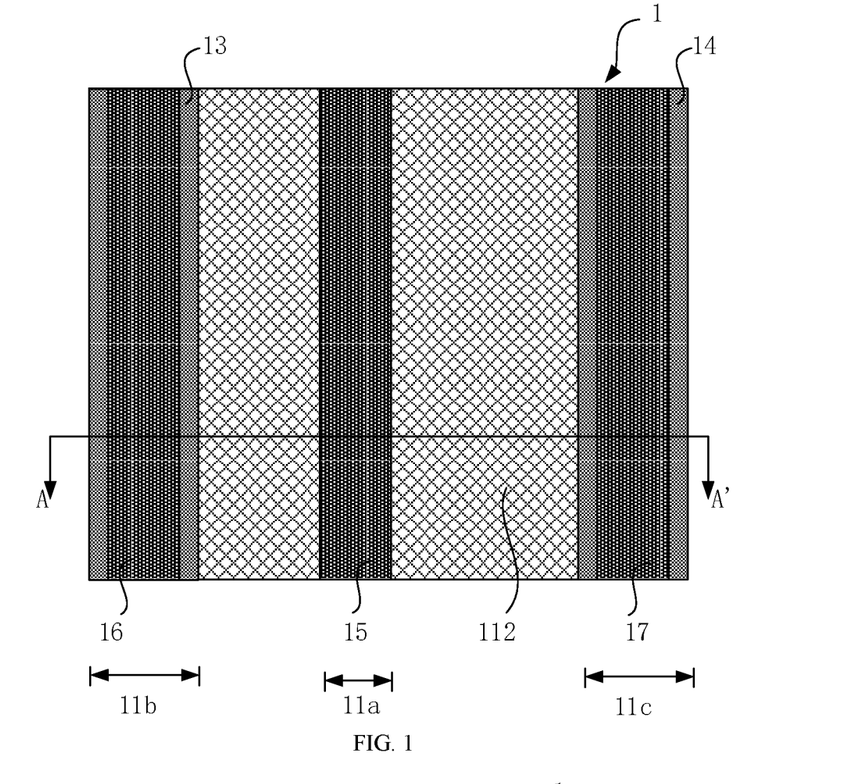
FIG. 1 is a schematic top view illustrating a GaN-based semiconductor structure according to a first embodiment of the present disclosure.
Figure 2:
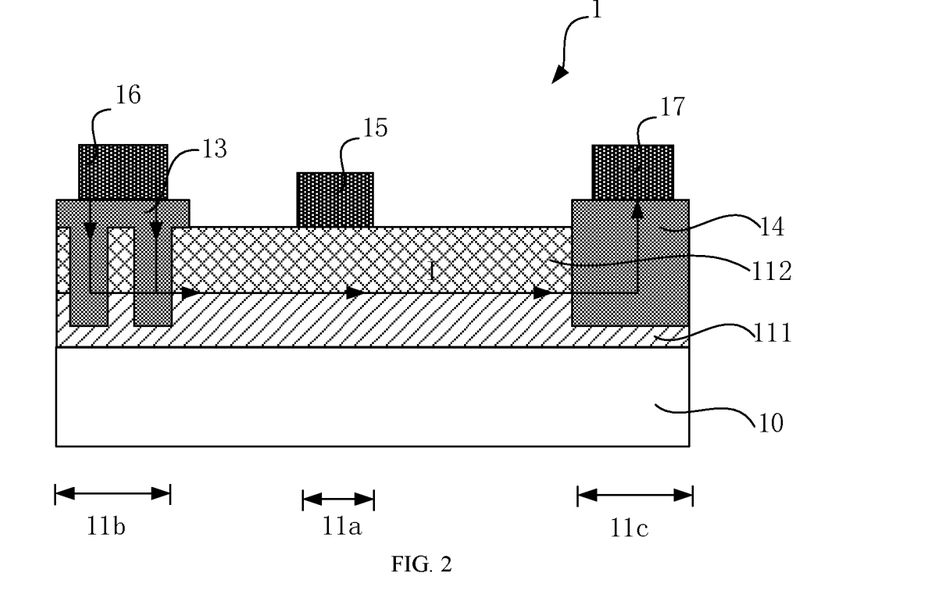
FIG. 2 is a cross-sectional view taken along line A-A' in FIG. 1.
Figure 3:
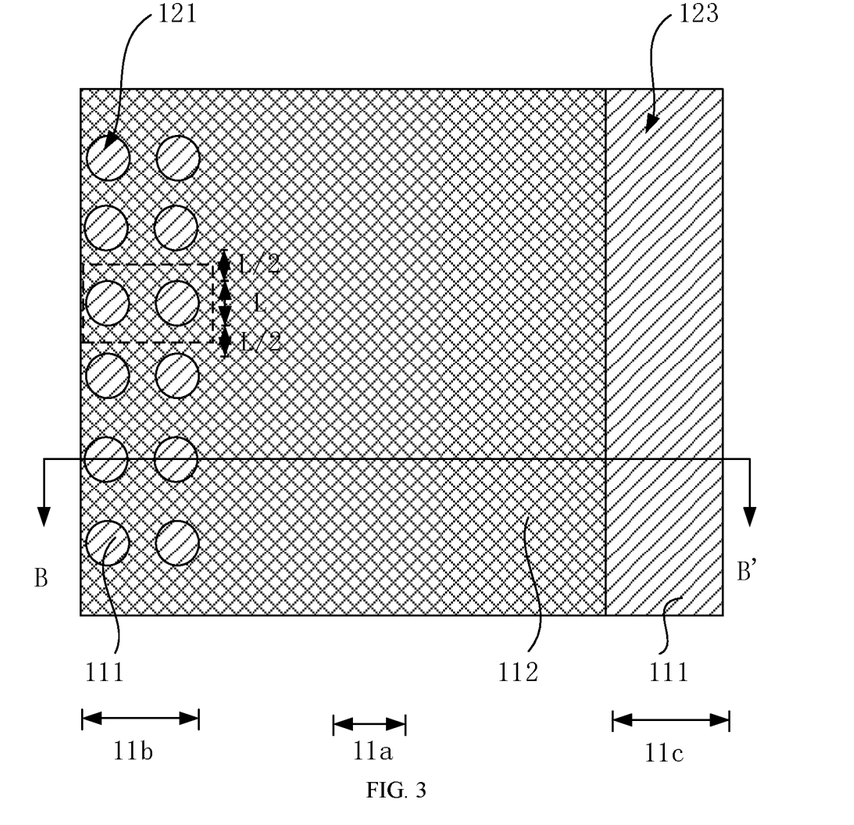
FIG. 3 is a schematic view illustrating a semiconductor structure after a gate electrode, a source electrode, a drain electrode, a source region N-type ion heavily-doped layer, and a drain region N-type ion heavily-doped layer in FIG. 1 are removed.
Figure 4:
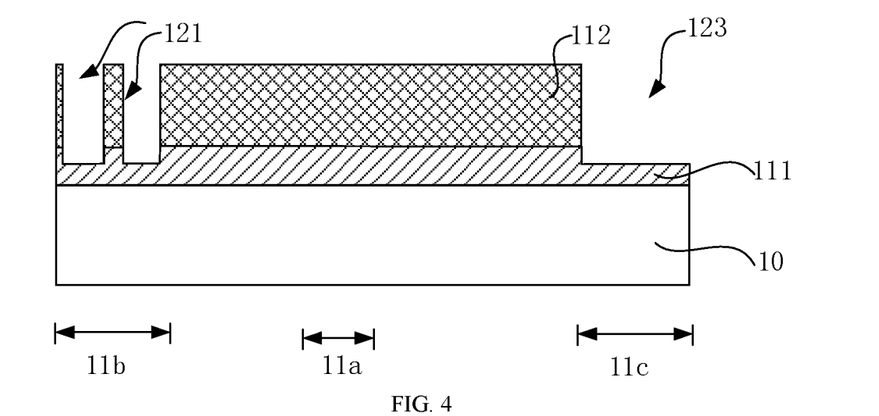
FIG. 4 is a cross-sectional view taken along line B-B' in FIG. 3.

FIG. 1 is a schematic top view illustrating a GaN-based semiconductor structure according to a first embodiment of the present disclosure. FIG. 2 is a cross-sectional view taken along line A-A' in FIG. 1. FIG. 3 is a schematic view illustrating a semiconductor structure after a gate electrode, a source electrode, a drain electrode, a source region N-type ion heavily-doped layer, and a drain region N-type ion heavily-doped layer in FIG. 1 are removed. FIG. 4 is a cross-sectional view taken along line B-B' in FIG. 3.

Referring to FIG. 1 to FIG. 4, a GaN-based semiconductor structure 1 includes: a substrate 10, a channel layer 111 and a barrier layer 112 sequentially stacked in a thickness direction from bottom to up, where the channel layer 111 and the barrier layer 112 each include a gate region 11a, a source region 11b and a drain region 11c located on both sides of the gate region 11a; a source region N-type ion heavily-doped layer 13 located in the source region 11b; a drain region N-type ion heavily-doped layer 14 located in the drain region 11c, where a part of the source region N-type ion heavily-doped layer 13 is embedded into the barrier layer 112 and a part of the channel layer 111; a gate electrode 15 located in the gate region 11a; a source electrode 16 located on the source region N-type ion heavily-doped layer 13; and a drain electrode 17 located on the drain region N-type ion heavily-doped layer 14.

A material of the substrate 10 can include a material such as sapphire, silicon carbide, silicon, or diamond.

The channel layer 111 and the barrier layer 112 form a heterojunction structure, and an interface between the channel layer 111 and the barrier layer 112 can form a two-dimensional electron gas.

Materials of both the channel layer 111 and the barrier layer 112 can be GaN-based materials. A band gap of the barrier layer 112 is larger than a band gap of the channel layer 111. The material of the barrier layer 112 can be AlGaN, and the material of the channel layer 111 can be GaN.

The gate region 11a, the source region 11b, and the drain region 11c each include a length direction and a width direction that are perpendicular to each other. Referring to FIG. 1 and FIG. 3, the length directions of the gate region 11a, the source region 11b, and the drain region 11c are lateral directions in FIG. 1; and the width directions of the gate region 11a, the source region 11b, and the drain region 11c are vertical directions in FIG. 1.

The part of the source region N-type ion heavily-doped layer 13 being embedded into the barrier layer 112 and the part of the channel layer 111 refers to the part of the source region N-type ion heavily-doped layer 13 being embedded into a certain distance below a heterojunction interface between the barrier layer 112 and the channel layer 111.

Materials of both the source region N-type ion heavily-doped layer 13 and the drain region N-type ion heavily-doped layer 14 can include N-type ion heavily-doped GaN-based materials. The GaN-based materials, for example, have a single-layer structure, and materials of the single-layer structure can include GaN, AlGaN, or InGaN. In an example, if the material of the single-layer structure is AlGaN, an aluminum (Al) amount in the single-layer structure gradually decreases from bottom to up in the thickness direction, where a maximum of the Al amount in a lowest part of the AlGaN layer is less than or equal to the Al amount in the barrier layer 112, such that a barrier height at an interface between the single-layer structure and the barrier layer 112 can be reduced.

The structure of the GaN-based materials can be a stacked structure. In an example, the stacked structure can include an AlGaN layer and a GaN layer from bottom to up in the thickness direction. The AlGaN layer can be a single layer in order to improve an infiltration characteristic at an interface between the AlGaN layer and the barrier layer 112. For example, an Al amount in the AlGaN layer gradually decreases from bottom to up in the thickness direction, where a maximum of the Al amount in a lowest part of the AlGaN layer is less than or equal to the Al amount in the barrier layer 112, such that a barrier height at an interface between the AlGaN layer and the barrier layer 112 can be reduced. In another example, the stacked structure can be a structure including a GaN-based superlattice structure and a GaN layer. The GaN-based superlattice structure is, for example, a superlattice structure in which a GaN layer and an AlGaN layer are periodically alternately formed, or a superlattice structure in which a GaN layer and an InGaN layer are periodically alternately formed. By introducing the superlattice structure, a square resistance of a top GaN layer can be further reduced, and a concentration of a two-dimensional electron gas at a heterojunction interface can be increased through a polarization effect, while a migration rate of the two-dimensional electron gas can be improved. The GaN-based superlattice structure can be arranged as a lower layer, and the GaN layer is an upper layer, or the GaN-based superlattice structure is arranged in the middle of the GaN layers, or the stacked structure is completely replaced with the GaN-based superlattice structure.

N-type elements doped in the source region N-type ion heavily-doped layer 13 and the drain region N-type ion heavily-doped layer 14 can include at least one of silicon (Si), germanium (Ge), stannum (Sn), selenium (Se) or tellurium (Te).

Materials of the gate electrode 15, the source electrode 16, and the drain electrode 17 can be metal, such as Ti/Al/Ni/Au or Ni/Au. A schottky contact can be formed between the gate electrode 15 and the barrier layer 112. An ohmic contact can be formed between the source electrode 16 and the source region N-type ion heavily-doped layer 13, and between the drain electrode 17 and the drain region N-type ion heavily-doped layer 14.

In this embodiment, referring to FIG. 3 and FIG. 4, the source region 11b has a plurality of first holes 121, and the first holes 121 extend into the barrier layer 112 and a part of the channel layer 111 in the thickness direction; the first holes 121 are filled with the source region N-type ion heavily-doped layer 13; the drain region 11c has a first groove 123, and the first groove 123 extends into the barrier layer 112 and a part of the channel layer 111 in the thickness direction; and the first groove 123 is filled with the drain region N-type ion heavily-doped layer 14.

In other embodiments, the source region 11b can have one first hole 121.

It should be noted that the source region N-type ion heavily-doped layer 13 in the first holes 121 can be grown simultaneously on bottom walls and side walls of the first holes 121, and the drain region N-type ion heavily-doped layer 14 in the first groove 123 can be grown simultaneously on a bottom wall and side walls of the first groove 123. For example, if the stacked structure of the source region N-type ion heavily-doped layer 13 and the drain region N-type ion heavily-doped layer 14 includes an AlGaN layer and a GaN layer from bottom to up in the thickness direction, the AlGaN layer is first grown on the side walls, because the material of the barrier layer 112 also includes AlGaN, which is beneficial to reduce the contact resistance.

The growth of the source region N-type ion heavily-doped layer 13 and the drain region N-type ion heavily-doped layer 14 can include two methods: a) epitaxially growing an N-type ion heavily-doped layer on the entire surface of a heterojunction structure with the first holes 121 and the first groove 123, then removing the N-type ion heavily-doped layer in other region by etching, and only remaining the source region N-type ion heavily-doped layer 13 located in the source region 11b and the drain region N-type ion heavily-doped layer 14 located in the drain region 11c; b) forming a mask layer, such as a silicon dioxide layer, on a heterojunction structure outside the source region 11b and the drain region 11c, and using the mask layer as a mask, epitaxially growing an N-type ion heavily-doped layer on the heterojunction structure to obtain the source region N-type ion heavily-doped layer 13 located in the source region 11b and the drain region N-type ion heavily-doped layer 14 located in the drain region 11c.

Referring to FIG. 4, in this embodiment, the side walls of the first holes 121 are vertical side walls. Referring to FIG. 3, in this embodiment, cross sections of the first holes 121 are circular, and the cross sections are surfaces parallel to a plane where the substrate 10 is located. Assuming that the cross sections of the first holes 121 have the same size, with a diameter of L, and an edge distance between bottom walls of adjacent first holes 121 is L/2, one unit is shown in a dotted box. Referring to FIG. 2 and FIG. 3, when the gate electrode 15 is applied with a turn-on voltage, and current I flows from the source electrode 16 to the drain electrode 17, a contact area corresponding to a resistance between the source region N-type ion heavily-doped layer 13 and the heterojunction interface in one unit is equal to: $2\pi L*H$, where H is a size of a contact surface between the heterojunction interface and the source region N-type ion heavily-doped layer 13 in the thickness direction.

Figure 5:
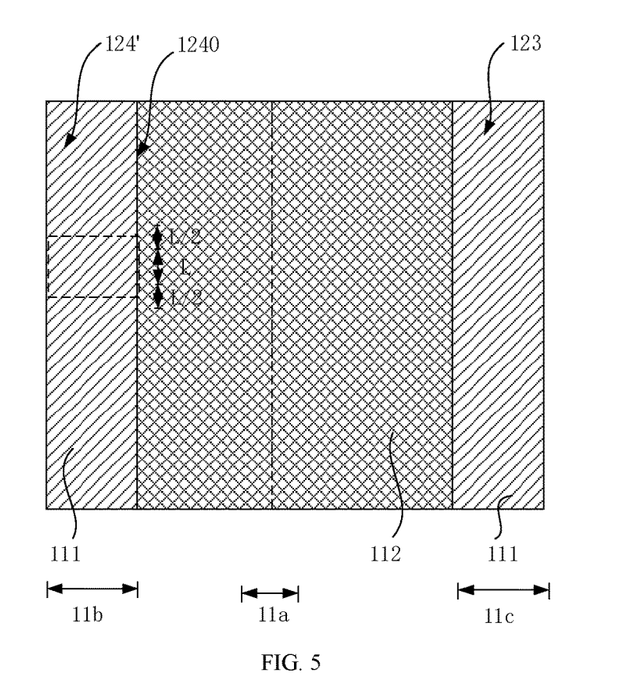
FIG. 5 is a schematic top view illustrating a GaN-based semiconductor structure in a comparative example after a gate electrode, a source electrode, a drain electrode, a source region N-type ion heavily-doped layer and a drain region N-type ion heavily-doped layer are removed.

FIG. 5 is a schematic top view illustrating a GaN-based semiconductor structure in a comparative example after a gate electrode, a source electrode, a drain electrode, a source region N-type ion heavily-doped layer and a drain region N-type ion heavily-doped layer are removed.

Referring to FIG. 5, in the comparative example, the source region 11b is provided with a second groove 124', and a cross section of the second groove 124' is rectangular. A bottom wall of the second groove 124' includes a first side edge 1240 close to the gate region 11a. The first side edge 1240 is a straight line parallel to a width direction of the gate region 11a (refer to a dotted line in FIG. 5). A contact area corresponding to a resistance between the source region N-type ion heavily-doped layer 13 and the heterojunction interface in one unit shown in a dotted box is equal to: $1.5L*H$, where H is a size of a contact surface between the heterojunction interface and the source region N-type ion heavily-doped layer 13 in the thickness direction.

It can be seen that, compared with the comparative example, according to this embodiment, by providing the first holes 121 in the source region 11b, the resistance between the source region N-type ion heavily-doped layer 13 and the heterojunction interface is reduced by $\frac{3}{4}\pi$. As hole ratios of the first holes 121 become larger, the resistance between the source region N-type ion heavily-doped layer 13 and the heterojunction interface decreases reciprocally. A hole ratio refers to a ratio of a volume of one first hole 121 to a unit volume of a unit cube with a width of the source region 11b being a unit width.

The hole ratios of the first holes 121 can be controlled by controlling a cross-sectional area of a single first hole 121, or by controlling a hole density of the first holes 121 and a distance between adjacent first holes 121, or by controlling a size of a single first hole in the thickness direction.

Figure 6:
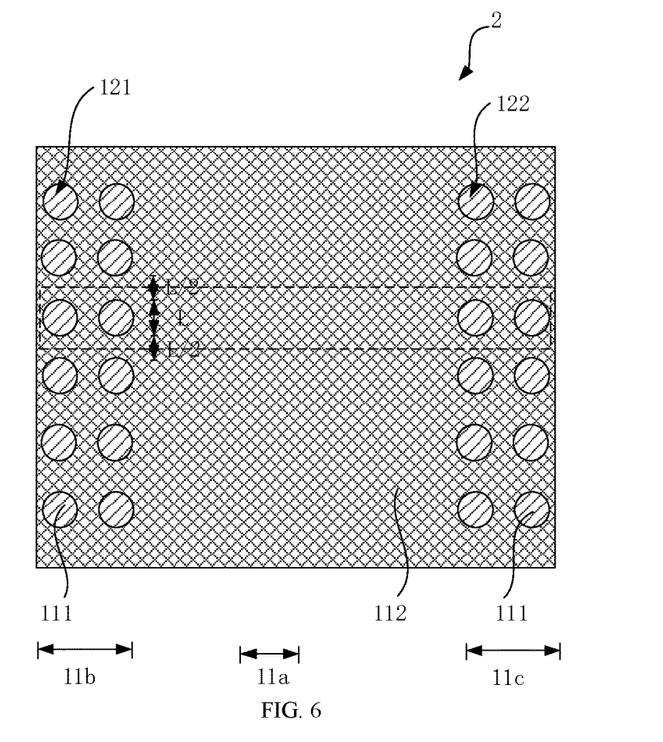
FIG. 6 is a schematic top view illustrating a GaN-based semiconductor structure after a gate electrode, a source electrode, a drain electrode, a source region N-type ion heavily-doped layer, and a drain region N-type ion heavily-doped layer are removed according to a second embodiment of the present disclosure.

FIG. 6 is a schematic top view illustrating a GaN-based semiconductor structure after a gate electrode, a source electrode, a drain electrode, a source region N-type ion heavily-doped layer, and a drain region N-type ion heavily-doped layer are removed according to a second embodiment of the present disclosure.

Referring to FIG. 6, differences between a GaN-based semiconductor structure 2 according to the second embodiment and the GaN-based semiconductor structure 1 according to the first embodiment lie in that: the drain region 11c further has a plurality of second holes 122, and the second holes 122 extend into the barrier layer 112 and a part of the channel layer 111 in the thickness direction; the second holes 122 are filled with the drain region N-type ion heavily-doped layer 14.

Referring to FIG. 2 and FIG. 6, when the gate electrode 15 is applied with a turn-on voltage, and a current I flows from the source electrode 16 to the drain electrode 17, a contact area corresponding to a resistance between the source region N-type ion heavily-doped layer 13 and the heterojunction interface in one unit is equal to: $2\pi L*H$, and a contact area corresponding to a resistance between the heterojunction interface and the drain region N-type ion heavily-doped layer 14 in one unit is equal to: $2\pi L*H$. Compared with the comparative example, according to this embodiment, by providing the first holes 121 in the source region 11b and providing the second holes 122 in the drain region 11c, a sum of the resistance between the source region N-type ion heavily-doped layer 13 and the heterojunction interface and the resistance between the heterojunction interface and the drain region N-type ion heavily-doped layer 14 is reduced by $3/4\pi$. Compared with the GaN-based semiconductor structure 1 according to the first embodiment, the GaN-based semiconductor structure 2 according to the second embodiment can further reduce the on-resistance.

Figure 7:
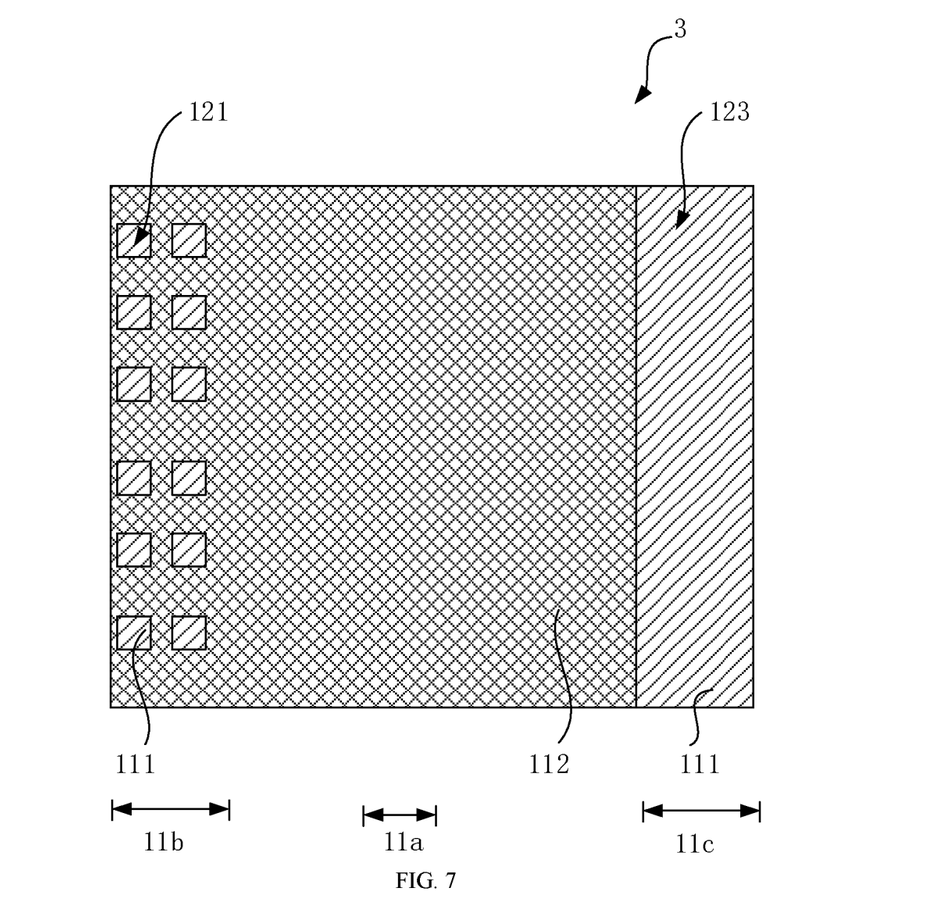
FIG. 7 is a schematic top view illustrating a GaN-based semiconductor structure after a gate electrode, a source electrode, a drain electrode, a source region N-type ion heavily-doped layer, and a drain region N-type ion heavily-doped layer are removed according to a third embodiment of the present disclosure.

FIG. 7 is a schematic top view illustrating a GaN-based semiconductor structure after a gate electrode, a source electrode, a drain electrode, a source region N-type ion heavily-doped layer, and a drain region N-type ion heavily-doped layer are removed according to a third embodiment of the present disclosure.

Referring to FIG. 7, a difference between a GaN-based semiconductor structure 3 according to the third embodiment and the GaN-based semiconductor structures 1 and 2 according to the first and second embodiments lies in that: the cross sections of the first holes 121 are rectangular.

In other embodiments, shapes of the cross sections of the first holes 121 can be elliptical, or triangular, rhombic, pentagonal or other polygonal shapes, or cross-shaped, or star-shaped. Alternatively, cross sections of some first holes 121 have different shapes from that of the rest of the first holes 121. In addition to symmetric arrangement shown in FIG. 7, the first holes 121 can be arranged asymmetrically. For example, if the shapes of the first holes 121 are cross-shaped, adjacent cross-shaped holes can be arranged in a mutually fitting manner, that is, the arrangement of the first holes 121 can be adaptively changed according to the shape of the first holes 121.

Figure 8:
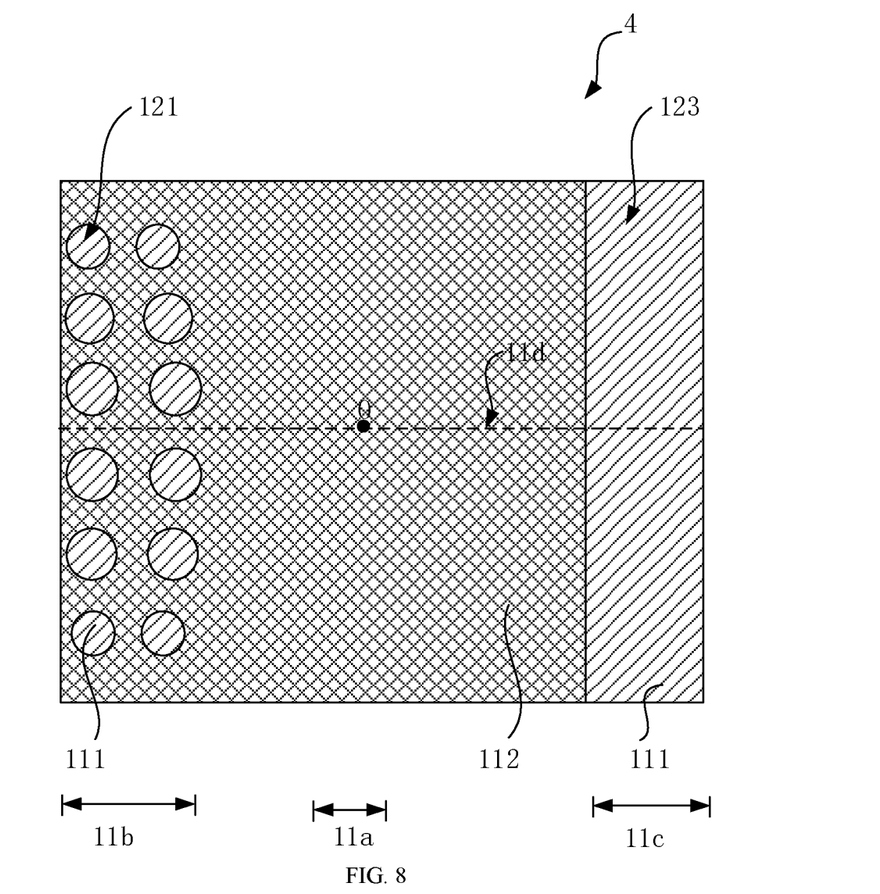
FIG. 8 is a schematic top view illustrating a GaN-based semiconductor structure after a gate electrode, a source electrode, a drain electrode, a source region N-type ion heavily-doped layer, and a drain region N-type ion heavily-doped layer are removed according to a fourth embodiment of the present disclosure.

FIG. 8 is a schematic top view illustrating a GaN-based semiconductor structure after a gate electrode, a source electrode, a drain electrode, a source region N-type ion heavily-doped layer, and a drain region N-type ion heavily-doped layer are removed according to a fourth embodiment of the present disclosure.

Referring to FIG. 8, differences between a GaN-based semiconductor structure 4 according to the fourth embodiment and the GaN-based semiconductor structures 1, 2 and 3 according to the first, second and third embodiments lie in that: the gate region 11a has a center section 11d, and the center section 11d is a surface formed by the thickness direction and the length direction of the gate region 11a, and passes through a center O of the gate region 11a in the width direction; in a direction from being away from the center section 11d to the center section 11d, in a unit cube with a width of the source region 11b being a unit width, the cross-sections of the first holes 121 have sizes changed in an ascending order.

In other embodiments, in the direction from being away from the center section 11d to the center section 11d, the cross-sections of the first holes 121 have sizes changed in a fluctuating trend or in a descending order. When the cross-sections of the first holes 121 have the sizes changed in the fluctuating trend, there can be two or more fluctuating periods.

In other embodiments, in the direction from being away from the center section 11d to the center section 11d, in the unit cube with the width of the source region 11b being the unit width, regardless of whether the hole ratios of the first holes 121 are changed in a fluctuating trend or in an ascending order or in a descending order, operations such as etching and cutting will occur during the preparation of the semiconductor structure, in the direction from being away from the center section 11d to the center section 11d, there will be problems of uneven defect distribution and uneven electric field distribution. By enabling the hole ratios of the first holes to be changed in the fluctuating trend or in the ascending order or in the descending order, a two-dimensional electron gas that passes through the source region 11b or the drain region 11c can be dispersed according to actual conditions in order to further balance the surface peak field electric value. When the hole ratios of the first holes 121 are changed in the fluctuating trend, there can be two or more fluctuating periods.

In other embodiments, in the direction from being away from the center section 11d to the center section 11d, in a unit cube where a width of the drain region 11c is a unit width, the hole ratios of the second holes 122 can be changed in an ascending order or in a fluctuating trend or in a descending order. When the hole ratios of the second holes 122 can be changed in the fluctuating trend, there can be two or more fluctuating periods.

In other embodiments, in a unit cube with widths of the source region 11b and the drain region 11c being unit widths, the hole ratio of the first holes 121 can be different form the hole ratio of the second holes 122.

Figure 9:
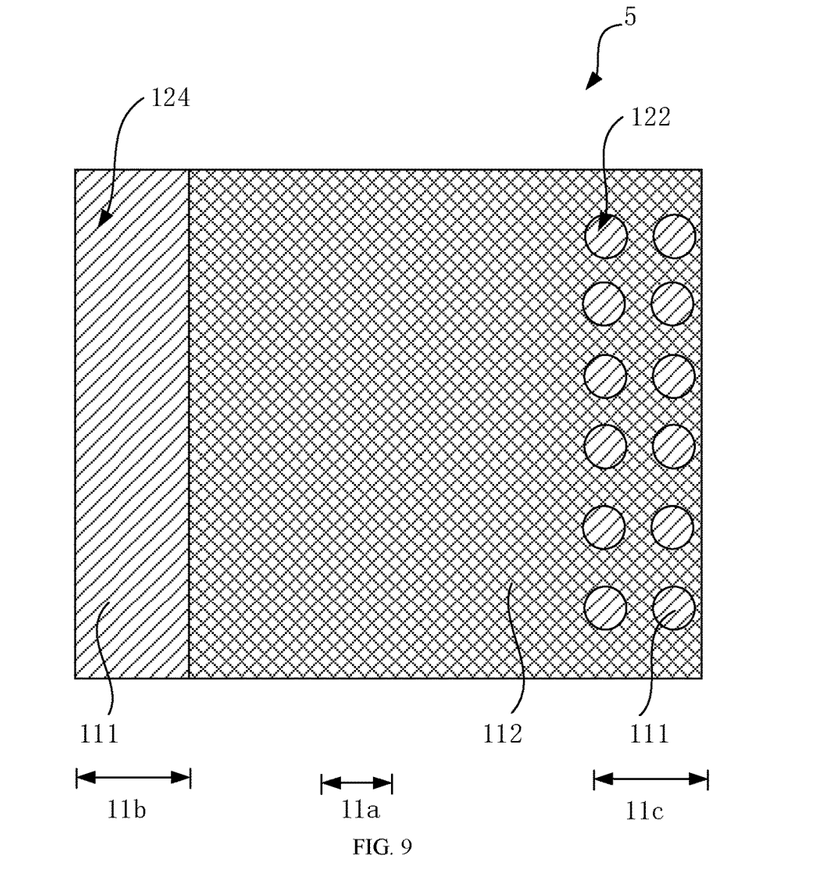
FIG. 9 is a schematic top view illustrating a GaN-based semiconductor structure after a gate electrode, a source electrode, a drain electrode, a source region N-type ion heavily-doped layer, and a drain region N-type ion heavily-doped layer are removed according to a fifth embodiment of the present disclosure.

FIG. 9 is a schematic top view illustrating a GaN-based semiconductor structure after a gate electrode, a source electrode, a drain electrode, a source region N-type ion heavily-doped layer, and a drain region N-type ion heavily-doped layer are removed according to a fifth embodiment of the present disclosure.

Referring to FIG. 9, differences between a GaN-based semiconductor structure 5 according to the fifth embodiment and the GaN-based semiconductor structures 1, 2, 3 and 4 of the first, second, third and fourth embodiments lie in that: the source region 11b has a second groove 124, and the second groove 124 extends into the barrier layer 112 and a part of the channel layer 111 in the thickness direction; the second groove 124 is filled with the source region N-type ion heavily-doped layer 13; the drain region 11c has a plurality of second holes 122 and the second holes 122 extend into the barrier layer 112 and a part of the channel layer 111 in the thickness direction; the second holes 122 are filled with the drain region N-type ion heavily-doped layer 14.

Figure 10:
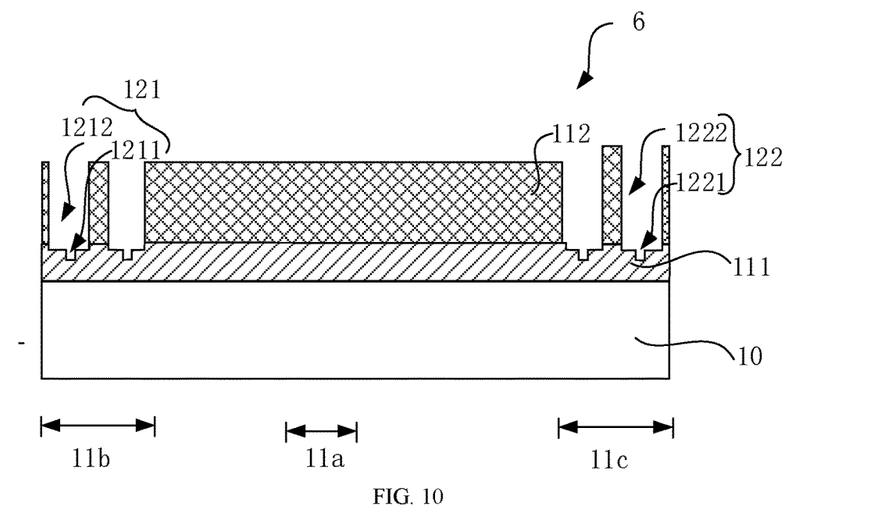
FIG. 10 is a schematic cross-sectional view illustrating a GaN-based semiconductor structure after a gate electrode, a source electrode, a drain electrode, a source region N-type ion heavily-doped layer, and a drain region N-type ion heavily-doped layer are removed according to a sixth embodiment of the present disclosure.

FIG. 10 is a schematic cross-sectional view illustrating a GaN-based semiconductor structure after a gate electrode, a source electrode, a drain electrode, a source region N-type ion heavily-doped layer, and a drain region N-type ion heavily-doped layer are removed according to a sixth embodiment of the present disclosure.

Referring to FIG. 10, differences between a GaN-based semiconductor structure 6 according to the sixth embodiment and the GaN-based semiconductor structures 1, 2, 3, 4 and 5 according to the first to fifth embodiments lie in that: each of the first holes 121 includes a first sub-hole 1211 and a second sub-hole 1212 stacked from bottom to up in the thickness direction, and an orthographic projection of the first sub-hole 1211 on the substrate 10 falls within an orthographic projection of the second sub-hole 1212 on the substrate 10; each of the second holes 122 includes a third sub-hole 1221 and a fourth sub-hole 1222 stacked from bottom to up in the thickness direction, and an orthographic projection of the third sub-hole 1221 on the substrate 10 falls within an orthographic projection of the fourth sub-hole 1222 on the substrate 10.

In addition, both the second sub-hole 1212 and the fourth sub-hole 1222 extend into the barrier layer 112 and a part of the channel layer 111 in the thickness direction.

In other words, side walls of both the first holes 121 and the second holes 122 are step-shaped. This is beneficial for secondary epitaxial growths of the source region N-type ion heavily-doped layer 13 and the drain region N-type ion heavily-doped layer 14. Compared with completely vertical side walls, the step-shaped side walls can eliminate gaps between the source region N-type ion heavily-doped layer 13 and the heterojunction interface, and gaps between the drain region N-type ion heavily-doped layer 14 and the heterojunction interface, improve a contact quality between the N-type ion heavily-doped layers and the heterojunction interface during the secondary epitaxial growth of the N-type ion heavily-doped layers, and greatly reduce the contact resistance.

In other embodiments, a) the first holes 121 and the second holes 122 with the step-shaped side walls can be used alternatively, or b) the second sub-hole 1212 and the fourth sub-hole 1222 alternatively extend into the barrier layer 112 and a part of the channel layer 111 in the thickness direction, or c) the second sub-hole 1212 extends into a part of the barrier layer 112 in the thickness direction, and the first sub-hole 1211 extends into the barrier layer 112 and a part of the channel layer 111 in the thickness direction, and/or the fourth sub-hole 1222 extends into a part of the barrier layer 112 in the thickness direction, and the third sub-hole 1221 extends into the barrier layer 112 and a part of the channel layer 111 in the thickness direction.

Figure 11:
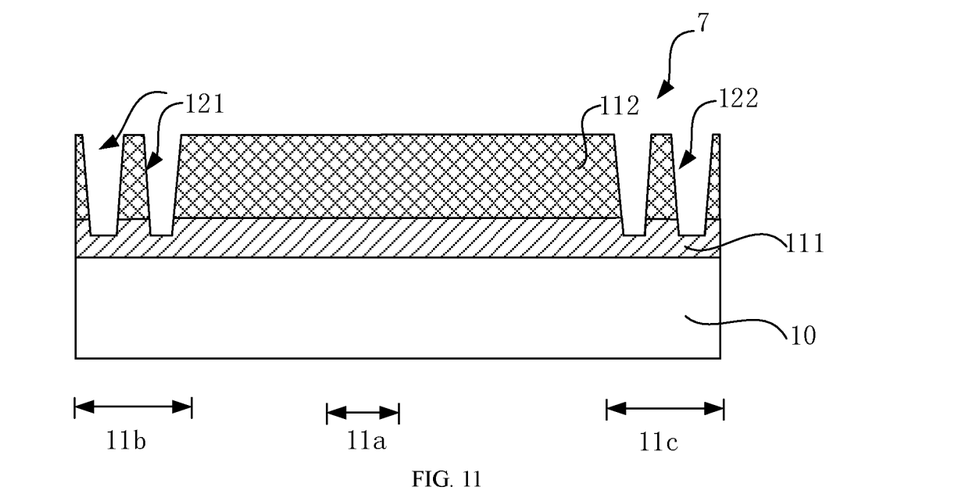
FIG. 11 is a schematic cross-sectional view illustrating a GaN-based semiconductor structure after a gate electrode, a source electrode, a drain electrode, a source region N-type ion heavily-doped layer, and a drain region N-type ion heavily-doped layer are removed according to a seventh embodiment of the present disclosure.

FIG. 11 is a schematic cross-sectional view illustrating a GaN-based semiconductor structure after a gate electrode, a source electrode, a drain electrode, a source region N-type ion heavily-doped layer, and a drain region N-type ion heavily-doped layer are removed according to a seventh embodiment of the present disclosure.

Referring to FIG. 11, differences between a GaN-based semiconductor structure 7 according to the seventh embodiment and the GaN-based semiconductor structures 1, 2, 3, 4, 5 and 6 according to the first to sixth embodiments lie in that: the side walls of the first holes 121 and the second holes 122 are inclined side walls, and shapes of both the first holes 121 and the second holes 122 are invertedly trapezoidal.

Compared with the vertical side walls, the side walls of the first holes 121 and the second holes 122 are inclined, which can increase the contact area corresponding to the resistance between the source region N-type ion heavily-doped layer 13 and the heterojunction interface, and the contact area corresponding to the resistance between the drain region N-type ion heavily-doped layer 14 and the heterojunction interface, thereby reducing the on-resistance. In addition, it is beneficial for the secondary epitaxial growth of the source region N-type ion heavily-doped layer 13 and the drain region N-type ion heavily-doped layer 14. Compared with completely vertical side walls, the inclined side walls can eliminate a gap between the source region N-type ion heavily-doped layer 13 and the heterojunction interface and a gap between the drain region N-type ion heavily-doped layer 14 and the heterojunction interface, and greatly reduce the contact resistance.

In other embodiments, the first holes 121 and the second holes 122 with inclined side walls can be used alternatively, or shapes of the first holes 121 and/or the second holes 122 are regularly trapezoidal.

Figure 12:
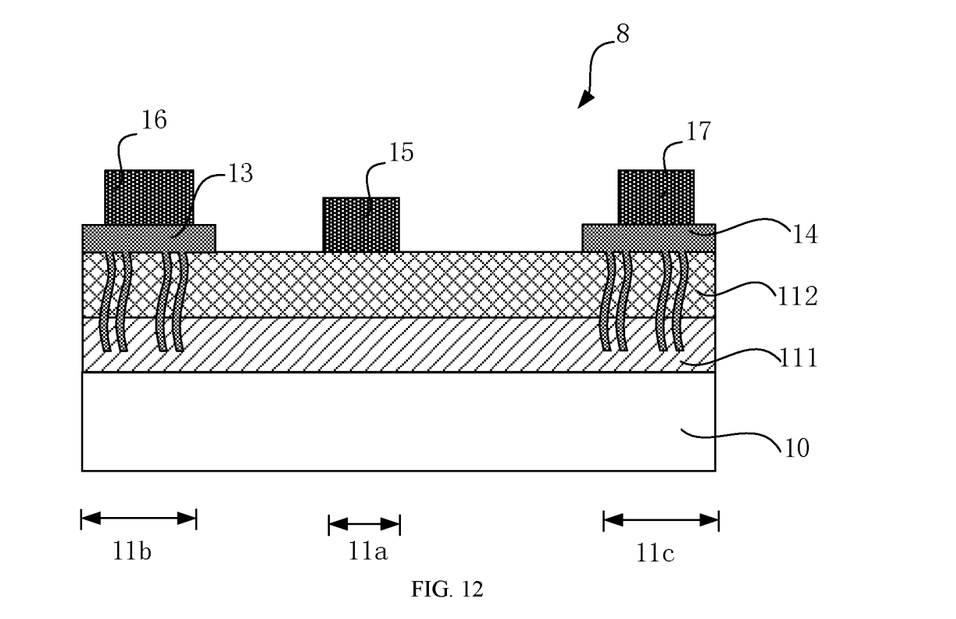
FIG. 12 is a schematic cross-sectional view illustrating a GaN-based semiconductor structure according to an eighth embodiment of the present disclosure.
Figure 13:
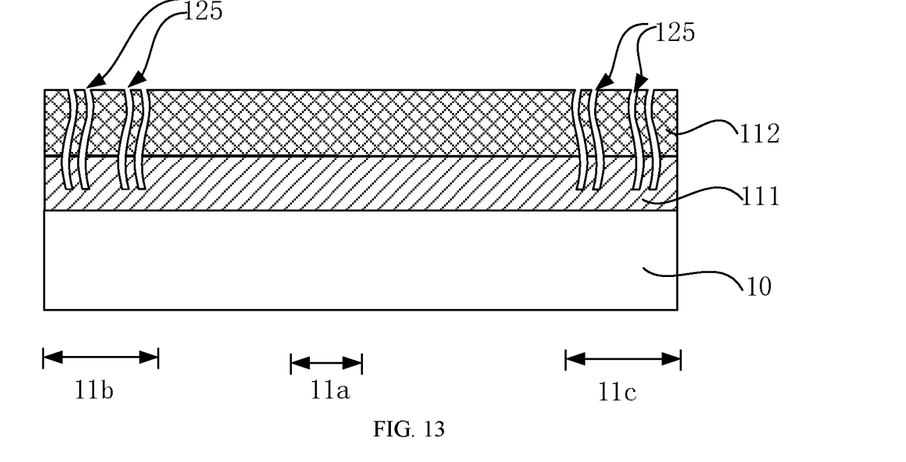
FIG. 13 is a schematic view illustrating a semiconductor structure after a gate electrode, a source electrode, a drain electrode, a source region N-type ion heavily-doped layer, and a drain region N-type ion heavily-doped layer in FIG. 12 are removed.

FIG. 12 is a schematic cross-sectional view illustrating a GaN-based semiconductor structure according to an eighth embodiment of the present disclosure. FIG. 13 is a schematic view illustrating a semiconductor structure after a gate electrode, a source electrode, a drain electrode, a source region N-type ion heavily-doped layer, and a drain region N-type ion heavily-doped layer in FIG. 12 are removed.

Referring to FIG. 12 and FIG. 13, differences between a GaN-based semiconductor structure 8 according to the eighth embodiment and the GaN-based semiconductor structure 1 according to the first embodiment lie in that: the source region 11*b* and the drain region 11*c* have cracks 125, and the cracks 125 extend into the barrier layer 112 and a part of the channel layer 111 in the thickness direction; the cracks 125 are correspondingly filled with the source region N-type ion heavily-doped layer 13 and the drain region N-type ion heavily-doped layer 14.

In other embodiments, the source region 11*b* and the drain region 11*c* can be alternatively provided with the cracks 125.

The cracks 125 can be formed through an annealing process.

Figure 14:
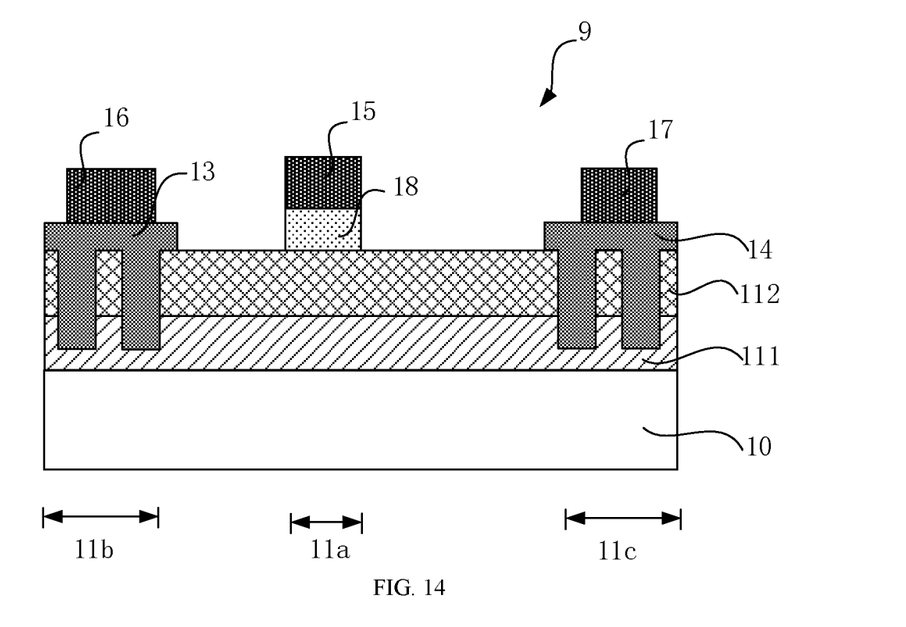
FIG. 14 is a schematic cross-sectional view illustrating a GaN-based semiconductor structure according to a ninth embodiment of the present disclosure.

FIG. 14 is a schematic cross-sectional view illustrating a GaN-based semiconductor structure according to a ninth embodiment of the present disclosure.

Referring to FIG. 14, a difference between a GaN-based semiconductor structure 9 according to the ninth embodiment and the GaN-based semiconductor structures 1, 2, 3, 4, 5, 6, 7 and 8 according to the first to eighth embodiments lies in that: a P-type semiconductor layer 18 is provided between the gate electrode 15 and the barrier layer 112.

Side walls of the P-type semiconductor layer 18 can be aligned with or be slightly wider than side walls of the gate electrode 15.

Materials of the P-type semiconductor layer 18 can be GaN-based materials, and P-type doped elements can include at least one of (magnesium) Mg, zinc (Zn), calcium (Ca), strontium (Sr) or barium (Ba).

The P-type semiconductor layer 18 can provide holes, and consume excess two-dimensional electron gas at the heterojunction interface to form an enhanced device.

Figure 15:
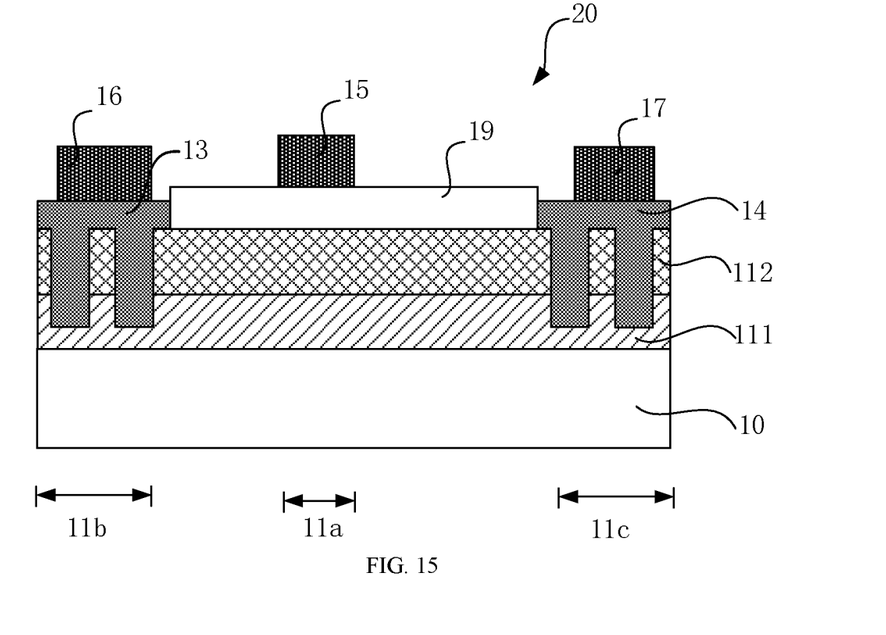
FIG. 15 is a schematic cross-sectional view illustrating a GaN-based semiconductor structure according to a tenth embodiment of the present disclosure.

FIG. 15 is a schematic cross-sectional view illustrating a GaN-based semiconductor structure according to a tenth embodiment of the present disclosure.

Referring to FIG. 15, a difference between a GaN-based semiconductor structure 20 according to the tenth embodiment and the GaN-based semiconductor structure 9 according to the ninth embodiment lies in that: a gate insulation layer 19 is provided between the gate electrode 15 and the barrier layer 112.

Materials of the gate insulation layer 19 can include at least one of silicon dioxide, silicon nitride or hafnium oxide.

The gate insulation layer 19 can enable the GaN-based semiconductor structure 20 to form a metal insulator semiconductor (MIS) device.

Although the present disclosure is described above, the disclosure is not limited thereto. Any person skilled in the art can make various changes and modifications without departing from the spirit and scope of the present disclosure. Therefore, the protection scope of the present disclosure should be based on the scope defined by the claims.

The invention claimed is:

1. A GaN-based semiconductor structure, comprising:
a substrate;

a channel layer;

a barrier layer, wherein the channel layer and the barrier layer are sequentially stacked on the substrate from bottom to up, and the channel layer and the barrier layer each include a gate region, a source region and a drain region located on both sides of the gate region;

a source region N-type ion heavily-doped layer located in the source region;

a drain region N-type ion heavily-doped layer located in the drain region, wherein a part of at least one of the source region N-type ion heavily-doped layer or the drain region N-type ion heavily-doped layer extends into the barrier layer and a part of the channel layer in a thickness direction;

a gate electrode located in the gate region of the barrier layer;

a source electrode located on the source region N-type ion heavily-doped layer; and a drain electrode located on the drain region N-type ion heavily-doped layer;

wherein the GaN-based semiconductor structure has one of following structures:

the source region has one or more first holes, the drain region has a first groove, the first groove extends into the barrier layer and the part of the channel layer in the thickness direction, and the first groove is filled with the drain region N-type ion heavily-doped layer;

the drain region has one or more second holes, the source region has a second groove, the second groove extends into the barrier layer and the part of the channel layer in the thickness direction, and the second groove is filled with the source region N-type ion heavily-doped layer; or one or more first holes are located in the source region, one or more second holes are located in the drain region, both the one or more first holes and the one or more second holes have cross sections, and the cross sections are surfaces parallel to a plane where the substrate is located; the one or more first holes and the one or more second holes have equal or unequal cross-sectional areas.

2. The GaN-based semiconductor structure according to claim 1, wherein at least one of the source region or the drain region has one or more holes, and the one or more holes extend into the barrier layer and the part of the channel layer in the thickness direction; one or more holes in the source region are filled with the source region N-type ion heavily-doped layer, and one or more holes in the drain region are filled with the drain region N-type ion heavily-doped layer.

3. The GaN-based semiconductor structure according to claim 2, wherein the one or more holes have cross sections, and the cross sections are surfaces parallel to a plane where the substrate is located; the cross sections of the one or more holes are circular, elliptical or polygonal.

4. The GaN-based semiconductor structure according to claim 3, wherein the one or more holes comprise two or more holes, the two or more holes having equal cross-sectional areas or unequal cross-sectional areas.

5. The GaN-based semiconductor structure according to claim 3, wherein the one or more holes comprise two or more holes, the two or more holes having same shapes or different shapes.

6. The GaN-based semiconductor structure according to claim 2, wherein the gate region has a center section, and the center section is a surface formed by the thickness direction and a length direction of the gate region, and passes through a center of the gate region in a width direction; in a direction from being away from the center section to the center section, in at least one of a unit cube with a width of the source region being a unit width or a unit cube with a width of the drain region being a unit width, hole ratios of the one or more holes are changed in a fluctuating trend or in an ascending order or in a descending order, wherein a hole ratio refers to a ratio of a volume of one hole to a unit volume.

7. The GaN-based semiconductor structure according to claim 6, wherein in at least one of the source region or the drain region, the one or more holes have cross-sectional areas changed in a fluctuating trend or in an ascending order or in a descending order.

8. The GaN-based semiconductor structure according to claim 6, wherein in at least one of the source region or the drain region, the one or more holes have a hole density changed in a fluctuating trend or in an ascending order or in a descending order.

9. The GaN-based semiconductor structure according to claim 1, wherein one or more first holes are located in the source region, and one or more second holes are located in the drain region; in a unit cube with widths of the source region and the drain region being unit widths, a hole ratio of the one or more first holes is different from a hole ratio of the one or more second holes.

10. The GaN-based semiconductor structure according to claim 1, wherein one or more first holes are located in the source region, one or more second holes are located in the drain region, and the one or more first holes and the one or more second holes have equal or unequal densities.

11. The GaN-based semiconductor structure according to claim 1, wherein one or more first holes are located in the source region, one or more second holes are located in the drain region, and the one or more first holes and the one or more second holes have same or different shapes.

12. The GaN-based semiconductor structure according to claim 2, wherein one of the one or more holes comprises a first sub-hole and a second sub-hole stacked from bottom to up in the thickness direction, and an orthographic projection of the first sub-hole on the substrate falls within an orthographic projection of the second sub-hole on the substrate.

13. The GaN-based semiconductor structure according to claim 12, wherein the second sub-hole extends into the barrier layer and the part of the channel layer in the thickness direction.

14. The GaN-based semiconductor structure according to claim 12, wherein the second sub-hole extends into a part of the barrier layer in the thickness direction, and the first sub-hole extends into the barrier layer and the part of the channel layer in the thickness direction.

15. The GaN-based semiconductor structure according to claim 2, wherein side walls of the one or more holes are vertical side walls or inclined side walls.

16. The GaN-based semiconductor structure according to claim 1, wherein at least one of the source region or the drain region has cracks, and the cracks extend into the barrier layer and the part of the channel layer in the thickness direction; the cracks are correspondingly filled with the source region N-type ion heavily-doped layer and the drain region N-type ion heavily-doped layer.

17. The GaN-based semiconductor structure according to claim 1, wherein the gate electrode and the barrier layer have one of following relationships:

the gate electrode contacts the barrier layer;

a P-type semiconductor layer is provided between the gate electrode and the barrier layer; or a gate insulation layer is provided between the gate electrode and the barrier layer.

\* \* \* \* \*